United States Patent [19]

Dell

[11] 4,077,034
[45] Feb. 28, 1978

[54] DATA COMPRESSION

[76] Inventor: Harold R. Dell, 4125 Sutherland Drive, Palo Alto, Calif. 94303

[21] Appl. No.: 520,431

[22] Filed: Nov. 4, 1974

[51] Int. Cl.$^2$ ............................................ H03K 13/24
[52] U.S. Cl. ............................................ 340/347 DD
[58] Field of Search .............. 340/347 DD; 325/38 R; 235/154

[56] References Cited

U.S. PATENT DOCUMENTS

| | | | |
|---|---|---|---|
| 3,093,707 | 6/1963 | Nicholson | 178/23 |
| 3,213,268 | 10/1965 | Ellersick, Jr. | 235/154 |
| 3,235,661 | 2/1966 | Oxley | 340/347 DD |
| 3,432,754 | 3/1969 | Schwartz | 325/38 R |
| 3,490,690 | 1/1970 | Apple et al. | 235/154 |
| 3,694,639 | 9/1972 | Deschenes et al. | 235/154 |
| 3,726,993 | 4/1973 | Lavallee | 340/347 DD |
| 3,813,485 | 5/1974 | Arps | 178/6.8 |
| 3,821,711 | 6/1974 | Elam et al. | 340/172.5 |
| 3,863,248 | 1/1975 | Deschenes et al. | 340/347 DD |

OTHER PUBLICATIONS

Ling & Palermo, "IBM Technical Disclosure Bulletin", vol. 15, No. 1, Jun. 1972, pp. 354–357.

*Primary Examiner*—Charles D. Miller
*Attorney, Agent, or Firm*—Warren M. Becker

[57] ABSTRACT

A data compression apparatus is described having an encoder and a decoder. Data in the form of an N-bit data message from an external data source is received in the encoder and stored in an N-bit memory. Coupled to the memory is a "one's" detector and three arithmetic units. The "one's" detector counts the number of logical "one's" in the N-bit message irrespective of their position in the memory for generating a number Q. The three arithmetic units sum columns of the contents of the memory in three predetermined sequences for generating three numbers A, B and C. The numbers A, B, C and Q are then used to form a P-bit data message, where P is less than N for a sufficiently large N – e.g., for N=256, N/P is approximately 2.8 – for transmission to the decoder. The decoder is provided with an N-bit memory, three arithmetic units and a comparison circuit. Upon receipt of the P-bit data message, Q logical "one's" are stored in the decoder memory. The arithmetic units in the decoder, as in the encoder, sum columns of the contents of the decoder memory in three sequences for generating three numbers A', B' and C'. The numbers A', B', and C' are compared with the numbers A, B and C in the comparison circuit. A shifting circuit controlled by the comparison circuit repetitively shifts the logical "one's" in the decoder memory until A'=A, B'=B and C'=C. When A'=A, B'=B and C'=C, the original N-bit data message is recreated and is available for use by an external utilization apparatus.

18 Claims, 13 Drawing Figures

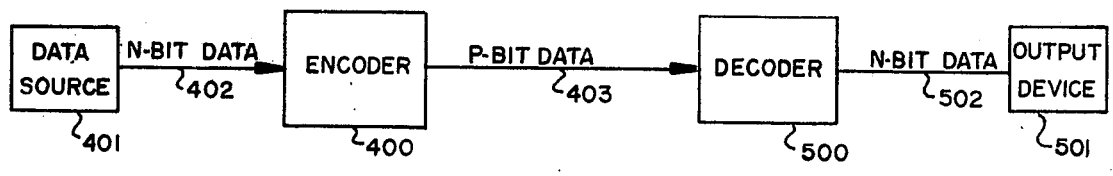
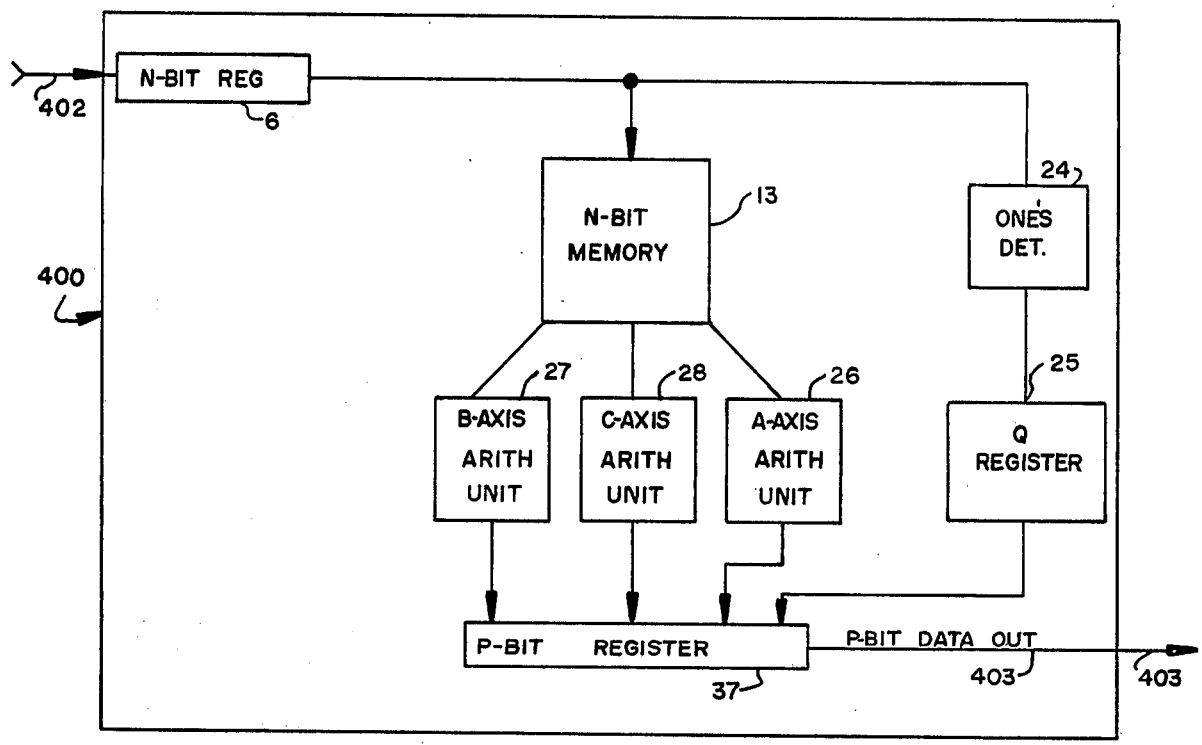
FIG. 1
FIG. 2A

ENCODER SEQUENCER 42

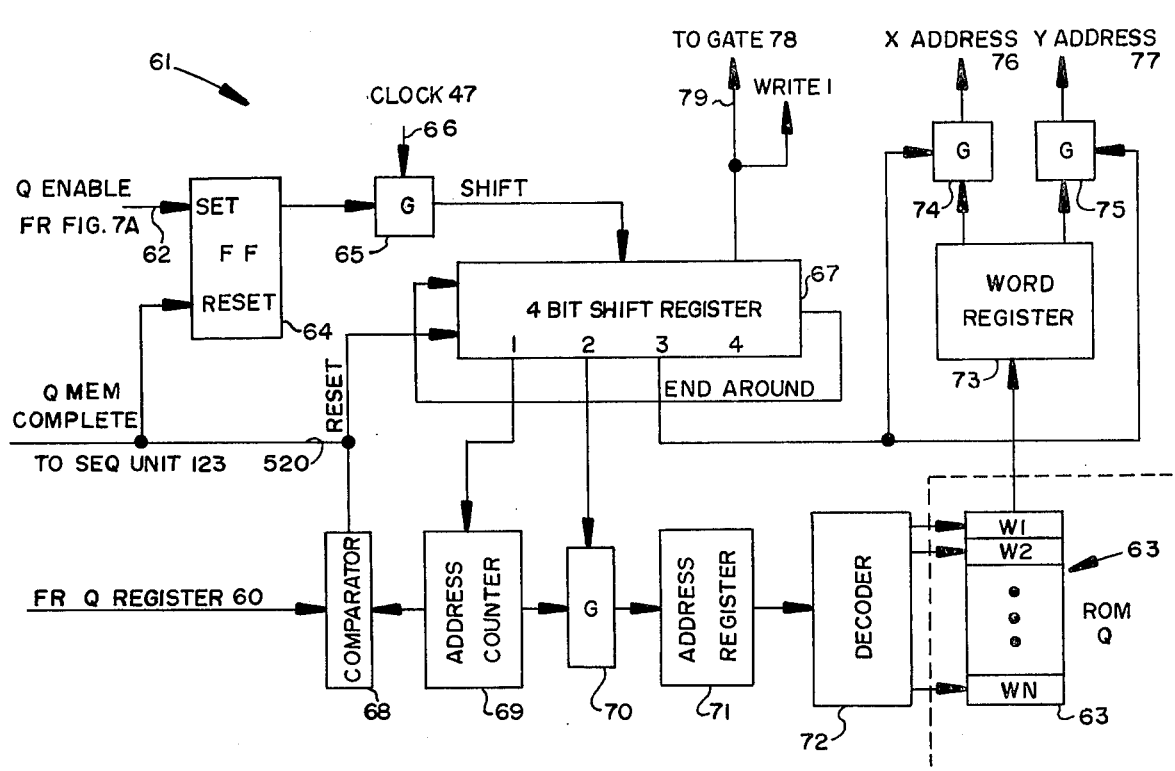
FIG. 8 Q MEMORY

A MEMORY

SEQUENCER 123

SEQUENCER 123

DATA COMPRESSION

BACKGROUND OF THE INVENTION

The present invention relates to data compression apparatus and methods in general, and in particular to a novel data compression apparatus and method for reducing the number of bits of data transmitted between a data source and a data utilization device.

The term data compression is commonly applied to a number of basically different types of apparatus and processes for performing data reduction. A first major classification of these processes is between irreversible and reversible processes. An irreversible process is one in which a certain portion of input information is irreversibly lost during data compression. Such processes include filtering, limiting, statistical moment estimation, etc. The class of reversible processes can be described as information-preserving. An information-preserving data compression process is one that, when applied to input data, reduces the amount of energy required to transmit characteristics of the data without reducing the information content of the data.

Another major distinction may be made between types of data — e.g., that for which statistical distribution information is known in advance, and that for which this information is not known. Examples of the first type are: 1) data obtained from video data encoding, possibly performed by one or two-dimensional run length processes, 2) message alphabets with known probability distributions, possibly obtained by Shannon-Fano-Huffman redundancy reduction processes, and 3) time-sampled instrumentation data, possibly performed by polynomial approximation or statistical prediction processes. A major example of input data about which no information is available is transmitted or stored computer data. Blocks of such data typically comprise a binary code of fixed length having $m$ bits with the probability of occurrence of $2^m$ binary patterns equal to one. Such a data block is typically composed of some fixed number of bits of useful data $n$, and another fixed number $p$ of one of several well-known Forward Error Correcting codes with $n + p = m$. Presently, however, the amount of data compression that can be achieved with processes in which no information is available in advance about the original data is limited.

SUMMARY OF THE INVENTION

In view of the foregoing, a principal object of the present invention is a novel and improved method and apparatus for data compression.

A further object is a method and apparatus for compressing data with little, if any, appreciable loss of information content.

A still further object is a method and apparatus for compressing data with little, if any, appreciable loss of information content notwithstanding a lack of prior known statistical distribution information about the data.

In keeping with the above objects, the principal features of the present invention are an encoder and a decoder for compressing and recreating an N-bit data message. The encoder includes an N-bit memory and means for generating a plurality of numbers A, B, C and Q corresponding to the total number of logical "one's" in the N-bit data message. Each of the numbers A, B and C is generated by summing columns of the contents of the memory in a plurality of distinct and independent sequences. The number Q is generated by counting the total number of "one's" in the N-bit data message independently of their position in the memory. For a sufficiently large N, where N is the number of bits in the N-bit data message, the numbers thus generated are combined to comprise a P-bit data message having a number of bits P, where P is less than N. In the embodiment disclosed, the numbers A, B and C are generated using three arithmetic units coupled to the N-bit memory. For generating the number Q there is provided a "one's" detector. As the memory is loaded with the N-bit data message, the arithmetic units and "one's" detector sum the "one's" in the message.

In the decoder, input register means are provided for receiving the P-bit data message from the encoder. Coupled to the input register means are a plurality of register means for receiving the A, B, C and Q segments of the P-bit data message. There is also provided in the decoder an N-bit memory to which is coupled three arithmetic units identical to those provided in the encoder. Upon transfer of the A, B, C and Q segments of the P-bit data message to the latter registers, Q "one's" are stored in the decoder N-bit memory. The Q "one's" are stored in the N-bit memory in either a random order, or, if statistical distribution information is available, according to a corresponding algorithm using a read-only memory (ROM). During the storing of the Q "one's" in the decoder memory, a plurality of numbers A', B' and C' are generated by the decoder arithmetic units. Like the numbers A, B and C generated in the encoder, the numbers A', B' and C' are generated by summing columns of the contents of the decoder memory in three independent and distinct sequences. Once generated, the numbers A', B' and C' are compared in a comparator means with the numbers A, B and C, respectively. If there is an equality between the numbers, the N-bit message in the decoder N-bit memory is assumed to be identical to the original N-bit message encoded in the encoder. However, if there is an inequality between the members of any pair of the numbers A' and A, B' and B or C' and C, the "one's" stored in the decoder memory are shifted about until the equality is created.

To provide the required shifting of "one's" in the N-bit decoder memory in the event of an inequality between the members in any of the above pairs of numbers, there is provided a plurality of memory control circuits and an equal number of associated read-only memories, ROM A, ROM B and ROM C.

The memory control circuits receive inputs from the comparator means. The inputs provide a signal representing the numerical relationship between the number pairs — e.g., "equal to," "less than," or "greater than." In the ROM's there is prestored a plurality of address pairs. The address pairs each comprise adjacent addresses of memory cell locations in the decoder N-bit memory. The address pairs are transferred to an intermediate pair of decoder N-bit memory word registers from the ROM's. Depending on whether a shift right or a shift left of a bit in the N-bit memory is required to reduce the inequality between a given number pair, one or the other of the N-bit memory addresses is transferred to the N-bit memory address registers. The bit stored at the address is read. If a shift appears possible, the bit at the adjacent address is read. If a required shift is permissible after these interrogations, a "one" and a "zero" are stored in the appropriate cells. This process, cyclical in nature, continues with respect to each of the number pairs until all inequality between each member of the pairs is eliminated or reduced to an acceptable level.

The principal advantage of the method and apparatus of the invention is that a reduction in the energy required to transmit data from one place to another can be achieved with and without prior known statistical distribution information about the data while preserving the information content of the data.

A further advantage of the present invention is that the apparatus and method are readily adaptable to changes in the number of bits of data required to be reduced.

DESCRIPTION OF THE DRAWINGS

The above and other objects, features and advantages of the present invention will become apparent from the following detailed description of a preferred embodiment of the invention and the accompanying drawings in which:

FIG. 1 is a generalized block diagram of a data compression system in accordance with the present invention.

FIGS. 2A and 2B are generalized block diagrams of the encoder and decoder of FIG. 1.

FIG. 8 is a more detailed block diagram of the Q Memory Control circuit and ROM Q of FIGS. 7A and 7B.

DETAILED DESCRIPTION

Figure 2B:
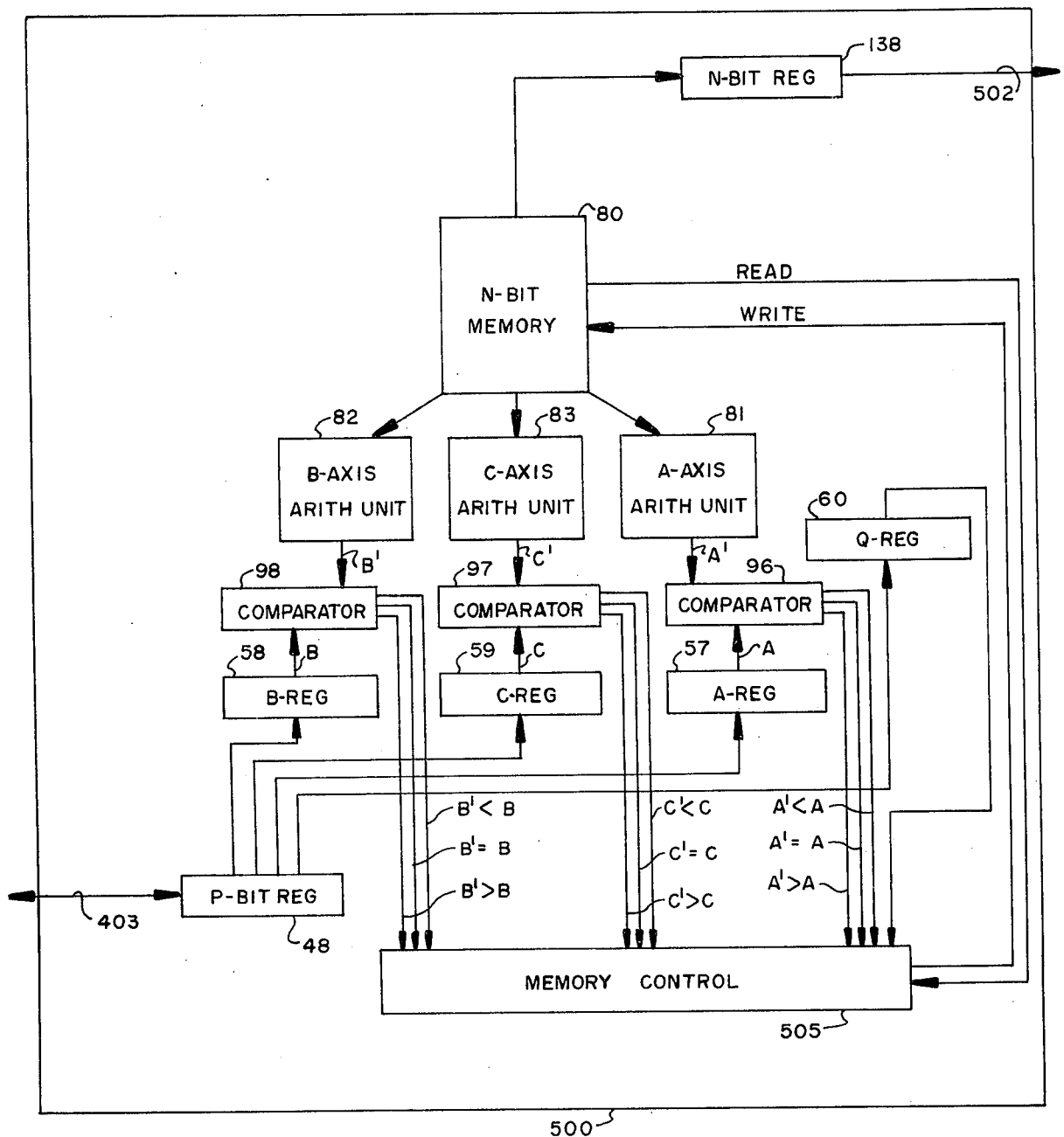

Referring to FIG. 1, there is provided in accordance with the present invention an encoder 400 and a decoder 500. Encoder 400 receives data in the form of an N-bit data message from a data source 401 on a line 402. The designation N is used for convenience to represent a predetermined number of bits N. In the example below, N equals 16, but any number of bits can be accommodated with appropriate modification in the capacity of the memories and registers. Source 401 may be a computer, instrumentation, or the like, which outputs data in the form of binary or logical "ones" and "zeros." It is, of course, possible to use number systems in other bases if equivalent equipment changes are made. Upon receipt from source 401, encoder 400 compresses the N-bit data message to a P-bit data message where P is less than N for a sufficiently large N — e.g., for N equals 256, N/P is approximately 2.8.

The P-bit data message generated in the encoder 400 is transmitted to the decoder 500 by means of a line 403. In the decoder, the P-bit data message is decoded to recreate the N-bit message, which is then available for transmission to and use by an output device 501 such as, for example, a computer, by means of a line 502. Lines 402, 403 and 502 are illustrated as wires, but it is understood that other means for data transmission may be employed, such as, for example, a radio link, laser beams, and the like, with suitable transmitting and receiving apparatus provided for at the input and output of the devices.

Referring to FIG. 2, there is provided a more detailed embodiment of the present invention showing the principal features. As seen in FIG. 2, encoder 400 is provided with an N-bit shift register 6 which is coupled to data source 401 by the line 402. The output of register 6 is coupled to an N-bit memory 13 for storing the N-bit data message and to a "one's" detector 24. Coupled to the output of detector 24 is a Q-register 25 for containing a number Q corresponding to the total number of logical "one's" in the N-bit data message, which are stored in the memory 13. Three arithmetic units 26, 27 and 28 are also provided coupled to memory 13 for accumulating in an associated A-register, B-register and C-register, respectively, a number A, B and C. Registers A, B and C are not shown as they are generally part of the arithmetic units but may be provided separate therefrom. As will be described below, arithmetic units 26, 27 and 28 generate the numbers A, B and C by summing columns of the logical "one's" stored in memory 13 in three predetermined individual sequences. Coupled to registers A, B, C and Q is a P-register 37. Register 37 is provided as a buffer register for receiving the numbers A, B, C and Q for transmission to the decoder in the form of a P-bit data message on the line 403.

In the decoder 500, there is provided a P-bit register 48. Register 48 is provided for receiving the P-bit data message generated in the encoder 400. Register 48 is coupled to an A, B, C and Q register 57, 58, 59 and 60, respectively. An N-bit memory 80 substantially identical to memory 13 of encoder 400 is provided also. Coupled to memory 80 are three arithmetic units 81, 82 and 83 for accumulating in an associated set of registers A', B' and C', as in encoder 400, a number A', B' and C' respectively. As in encoder 400, numbers A', B' and C' are generated by summing columns of the contents of the memory 80 in three individual predetermined sequences. Between registers A' and A, B' and B, and C' and C there are provided three comparators 96, 97 and 98, respectively. Comparators 96, 97 and 98 serve to control a plurality of memory control circuits 505. Control circuits 505 serve to repetitively shift the logical "one's" in memory 80 until the number A' equals A, B' equals B and C' equals C. When these conditions exist, an N-bit data message is created in memory 80 which corresponds to the original N-bit data message encoded in the encoder 400. An N-bit register 138 is provided for receiving the N-bit data message from memory 80 when decoding is completed, for transmission to the output device 501.

Figure 3:
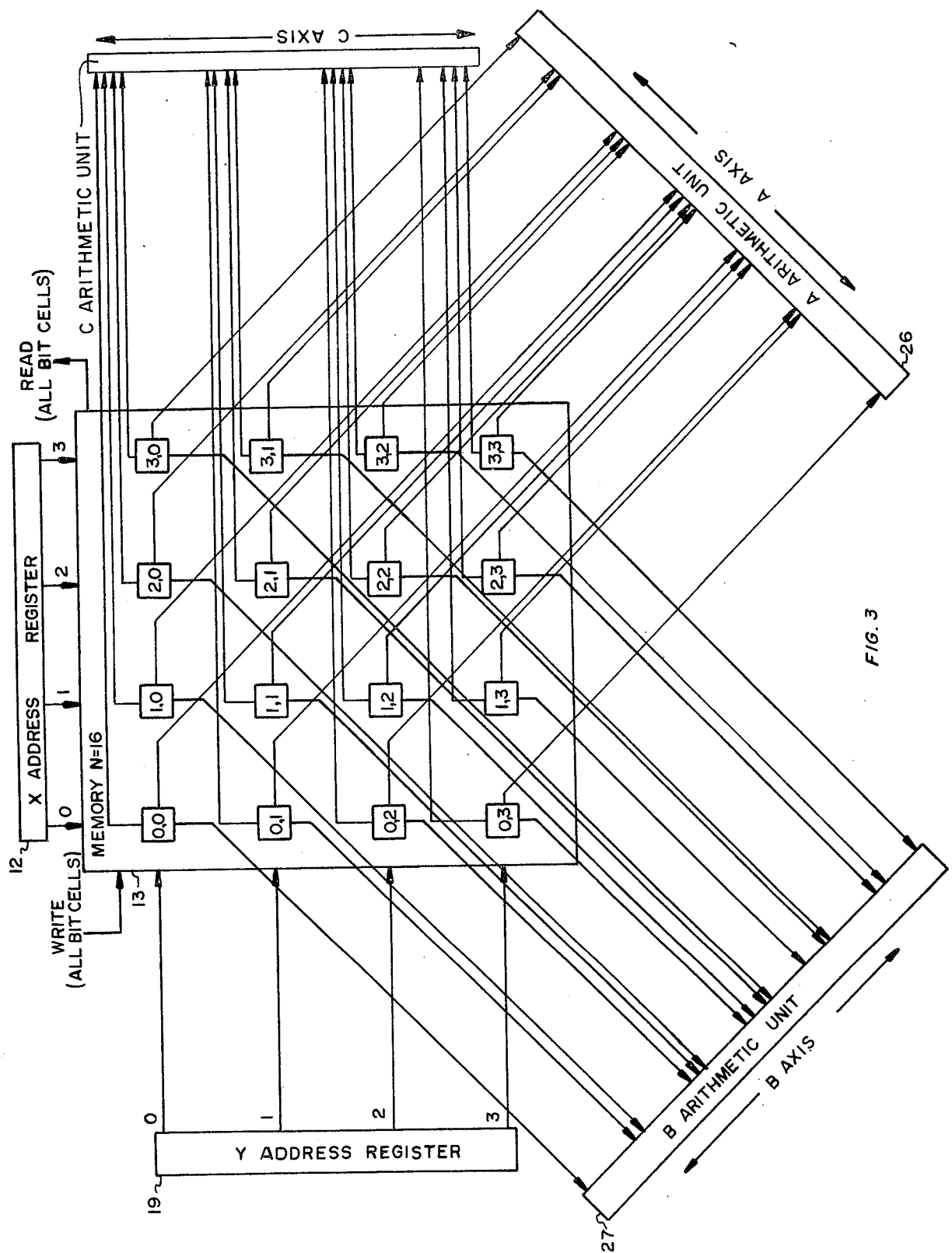
FIG. 3 is a block diagram of the N-bit memory, address registers and arithmetic units of the encoder of FIGS. 2A and 2B.
Figure 4:
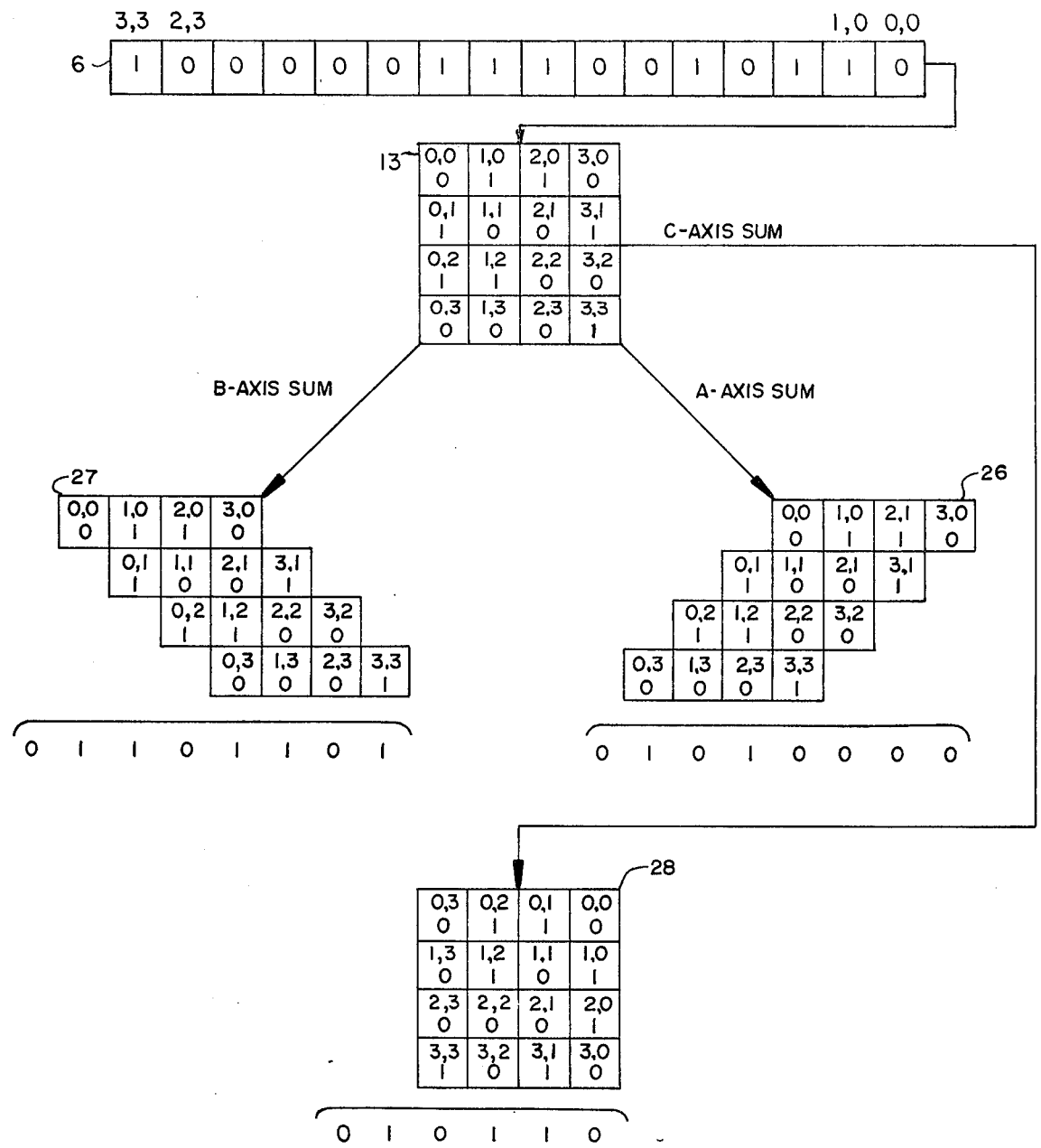
FIG. 4 is a diagrammatic representation of the contents of the N-bit register, N-bit memory and A, B and C axis sums generated in an exemplary operation of the encoder of FIGS. 2A and 2B.

Referring to FIGS. 3 and 4, a typical N-bit memory 13 is illustrated for N equals 16. Memory 13 is provided with a plurality of memory cells having X and Y coordinates 0,0; 1,0 . . . 2,3; 3,3. As described below, an X-address register 12 is provided to address the X coordinates and a Y register 19 is provided to address the Y coordinates.

The previously described summing of columns of the contents of memory 13 in three predetermined sequences is provided by coupling the A, B and C arithmetic units 26, 27 and 28 in a predetermined fashion to the memory cells in the memory 13. For convenience, the coupling may be thought of as horizontal and along a left and a right diagonal of the memory. Thus, the coupling of the C arithmetic unit 28 is such that the least significant digit of the number C is the sum of the contents in the "column" of cells 0,0; 1,0; 2,0; and 3,0 and the most significant digit is the sum plus any carries of the contents in the "column" of cells 0,3; 1,3; 2,3; and 3,3. Similarly, the coupling of the A arithmetic unit 26 is such that the least significant digit of the number A is the sum of the contents in the "column" of cells — in this case, a single cell 3,0 — and the most significant digit is the sum plus any carries of the contents in the cell 0,3. Likewise, the coupling of the B arithmetic unit is such that the least significant digit of the number B is the sum of the contents in cell 3,3, while the most significant digit is the sum plus any carries of the contents in cell 0,0. As seen more clearly in FIG. 4, the least significant bit of an N-bit data message in register 6 will be stored in cell 0,0, the next in cell 1,0 and the most significant bit in cell 3,3. Thus, upon encoding a 16-bit data message wherein, for example, the number in register 6 is 1000001110010110, the number A is 01010000, the number B is 01101101, the number C is 10110 and Q, the total number of "one's" irrespective of their position in memory 13, is 0111.

It is apparent from the above example that for N=16, there is no data compression. Nevertheless, the example is sufficient to illustrate the scheme wherein, for example, an N equal to 256 provides a compression ratio N/P of approximately 2.8.

Figure 5:
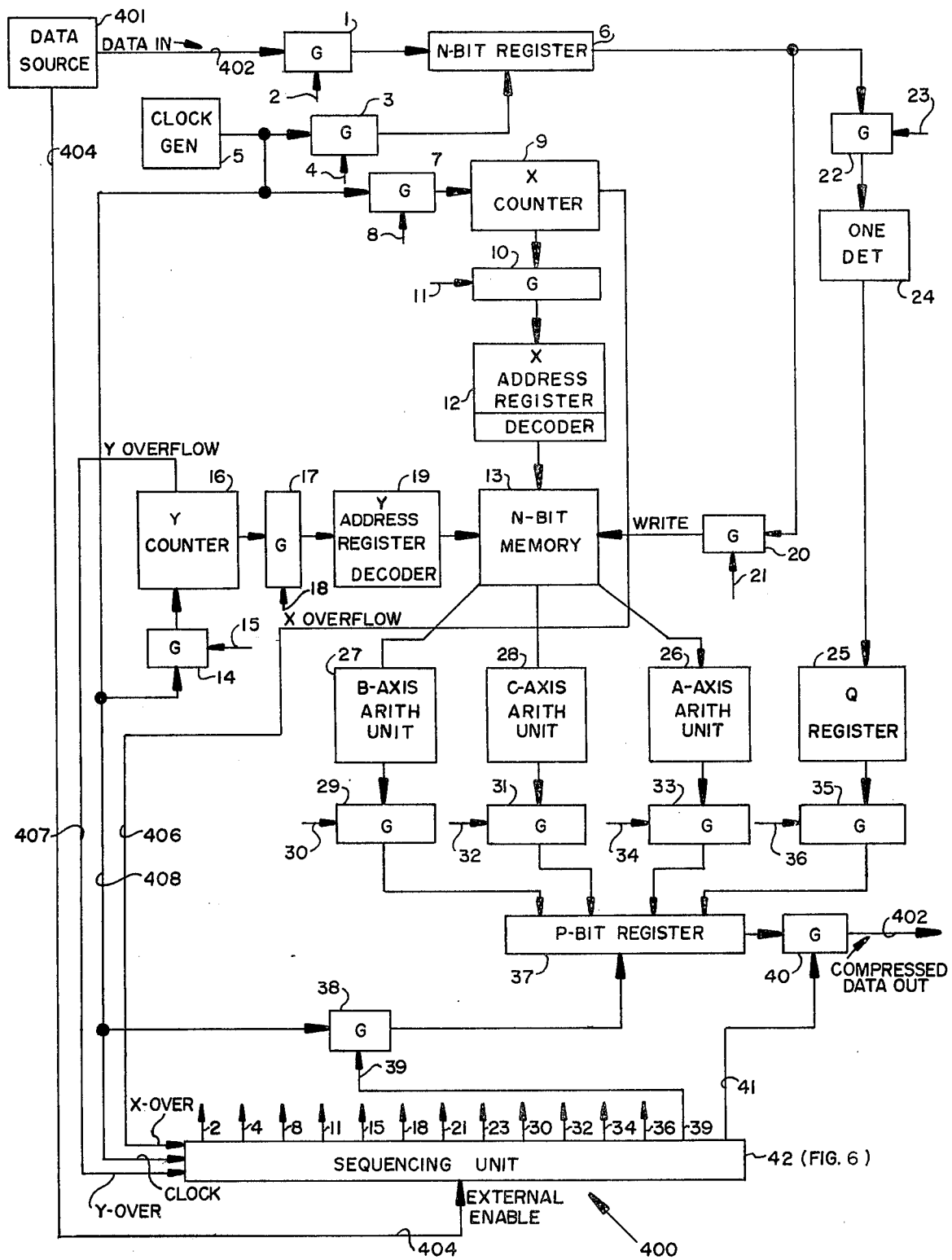
FIG. 5 is a more detailed block diagram of the encoder of FIGS. 2A and 2B.
Figure 6:
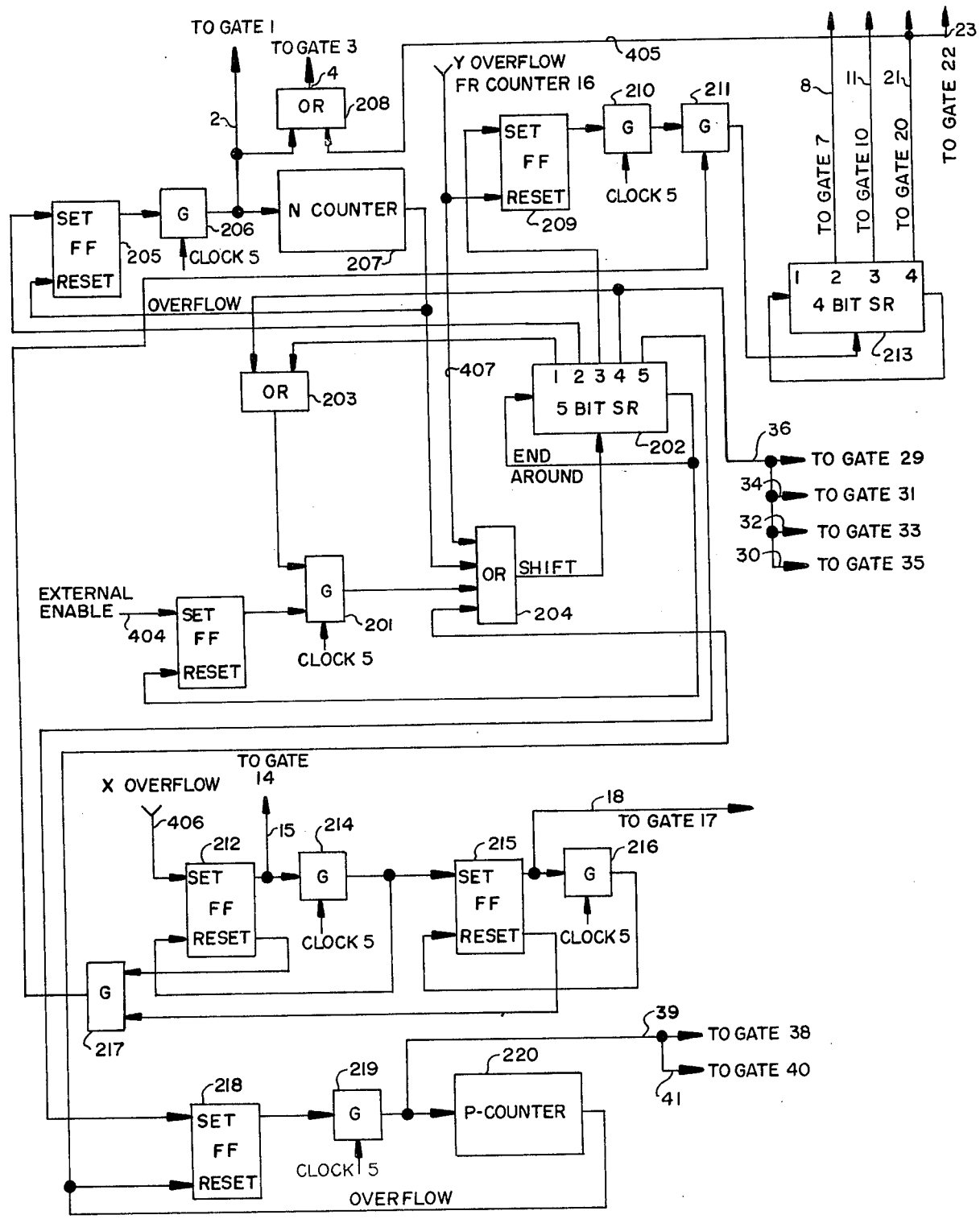
FIG. 6 is a detailed block diagram of the sequencing unit of FIG. 5.

Referring to FIGS. 5 and 6, there is shown a still more detailed embodiment of the encoder 400 wherein there is provided an AND gate 1 for gating an N-bit data message from the source 401 to the register 6. For convenience, the AND gates described herein are designated G, and OR gates are designated OR. A clock generator 5 is provided for providing shift pulses to the register 6 through an AND gate 3. On the output of register 6 there is provided a pair of AND gates 20 and 22. Gate 20 is provided for gating bits from the register 6 to memory 13. Gate 22 is provided for gating bits to the "one's" detector 24. Memory 13 is addressed by registers 12 and 19. Registers 12 and 19, in turn, receive their respective inputs from an X-counter 9 through an AND gate 10, and a Y-counter 16 through an AND gate 17. Counters 9 and 16 are incremented by clock pulses from clock generator 5 through a pair of AND gates 7 and 14, respectively. The numbers A, B, C and Q generated in the Q-register 25 and in the arithmetic units 26, 27 and 28 are gated into the P-register 37 through a plurality of AND gates 29, 31, 33 and 35 to form the P-bit data message. An output AND gate 40 is provided on the output of register 37 and a source of shift pulses for shifting the data out is provided by clock generator 5 through an AND gate 38. To control the operation of each of the described AND gates and, hence, the operation of the encoder 400, there is provided a sequencing unit 42. Unit 42 is provided to have a plurality of input lines comprising an external enable line 404, a pair of X and Y counter overflow input lines 406 and 407 and a clock input line 408 for carrying clock pulses from generator 5, and a plurality of output lines coupled to the aforementioned gates as hereinafter described with respect to FIG. 6.

Referring to FIG. 6, there is provided in sequencing unit 42 a flip-flop (FF) 200 having a set and reset input and a set output. The set input of FF 200 is coupled to the line 404 for receiving the external enable signal. The set output is coupled through an AND gate 201 and an OR gate 204 to the shift pulse input of a 5-stage shift register 202 for initiating and terminating the operation of the unit 42. All of the flip-flops described herein which are shown as boxes designated FF are provided with set and reset inputs designated by the terms "set" and "reset", and set and reset outputs designated by arrows extending from the upper and lower portions of the boxes, respectively. The register 202 coupled to FF 200 is provided with an end-around line for presetting the first stage of the register from the last stage and receives its shift pulses from generator 5 through gates 201 and 204. The first and fourth stages of register 202 are coupled to an OR gate 203 which is, in turn, coupled to gate 201 for controlling the shifting of the register by the clock. The fourth stage of register 202 is also coupled by means of a plurality of lines 30, 32, 34 and 36 to the P-register input gates 29, 31, 33 and 35 for controlling the gates. The second stage of register 202 is coupled to the set input of a FF 205, the third stage is coupled to the set input of a FF 209 and the fifth stage is coupled to the set input of a FF 218. The set output of FF 205 is coupled by means of an AND gate 206 to an N-counter 207. Gate 206 is coupled to clock generator 5 and directly to gate 1 by means of a line 2, and through an OR gate 208 and a line 4 to the gate 3. The output of counter 207 is coupled to the reset input of the FF 205 and to the shift input of register 202 through the gate 204 for controlling the transfer of an N-bit data message from the source 401 to the register 6. The Y-overflow input line 407 to sequencing unit 42 is coupled to the shift input of register 202 through gate 204 and to the reset input of the FF 209 for indicating the completion of the loading of the N-bit data message in memory 13. To load memory 13, FF 209, which is set by the third stage of register 202, is coupled by means of a pair of AND gates 210 and 211 to the shift pulse input of a 4-stage shift register 213. Register 213 is provided with an end-around line coupling the first and last stages for presetting the first stage and has its second and third stages, respectively, coupled to gates 7 and 10, and its fourth stage coupled to gates 20 and 22 by means of a plurality of lines 8, 11, 21 and 23. The fourth stage of register 213 is also coupled to gate 208 by means of a line 405 for shifting the register 6. Clock pulses for shifting register 213 are provided by generator 5 through gate 210.

To advance Y-counter 16 and, hence, address register 19, the X-overflow line 406 from counter 9 is coupled to the set input of a flip-flop 212 for generating a signal on a line 15 coupled to gate 14. FF 212 is also coupled to the set input of a FF 215 through an AND gate 214. The output of gate 214 is also coupled to the reset input of FF 212 for resetting the flip-flop. The reset output of FF 212 is, in turn, coupled to gate 211 through an AND gate 217. The set output of FF 215 is coupled by a line 18 to gate 17 for transferring the counter Y contents to Y address register 19 and through an AND gate 216 to its reset input. The reset output of FF 215 is also coupled to gate 211 through gate 217 for controlling shifting of the register 213.

The set output of FF 218 which has its set input coupled to the fifth stage of register 202 is coupled, by means of an AND gate 219, to gates 38 and 40 by means of a pair of lines 39 and 41, respectively, and to a P-counter 220. Clock pulses for controlling gates 38 and 40 and advancing counter 220 are provided by generator 5 through the gate 219. The output of counter 220 is coupled to the reset input of FF 218 and to the shift input of register 202 through gate 204.

In operation, a requirement for data compression by the data source 401 results in the generation of the external enable signal indicating that an N-bit data message is ready for encoding. The enable signal sets FF 200 causing register 202 to be advanced to its second stage. Register 202 is initially in its first stage due to the end-around pulse generated during a previous cycle. With register 202 in its second stage, FF 205 is set causing clocks to enter N-counter 207 through gate 206 and the shifting of the N-bit data message from source 401 into register 6.

When counter 207 overflows, indicating N-bits have been shifted, FF 205 is reset and register 202 is advanced to stage 3, setting FF 209 and advancing register 213. This is possible since gate 211 is initially enabled due to the resetting of FF 212 and FF 215 at the end of a previous cycle. Register 213 continues to be advanced sequentially through its four stages until a line of memory 13 in the X-direction is loaded from register 6, at which time an X-overflow pulse is generated by the X-counter 9 setting FF 212 and disabling gate 211. The setting of FF 212 also advances the Y-counter 16 and sets FF 215, which advances the Y-address register 19 and re-enables gate 211 for continuing the advancement of register 213 for loading a second line of cells in the memory. The cyclical operation of register 213, FF 212 and FF 215 continues until all of the bits of the N-bit data message in register 6 are transferred to the memory 13, at which time a Y-overflow pulse is generated. During the time that the memory is being loaded, the numbers A, B, C and Q are being generated by the arithmetic units 26, 27 and 28 and the "one's" detector 24. When the Y-overflow pulse is generated, FF 209 is reset and register 202 is advanced to its fourth stage enabling gates 29, 31, 33 and 35, transferring the A, B, C and Q numbers generated during the storage of the N-bit data message in memory 13 from the A, B, C and Q registers to the P-register 37. As previously described, the numbers A, B and C correspond to the total number of logical "one's" counted in three separate independent positional sequences in memory, and Q corresponds to the total number of logical "one's" in the memory independent of their position. When the transfer to the P-register 37 is completed, register 202 is advanced to its fifth stage setting FF 218. The setting of FF 218 enables gates 38 and 40 and advances P-counter 220 for transferring the P-bit data message to the decoder 500 or an intermediate buffer register to free up the encoder for further encoding.

Figure 7A:
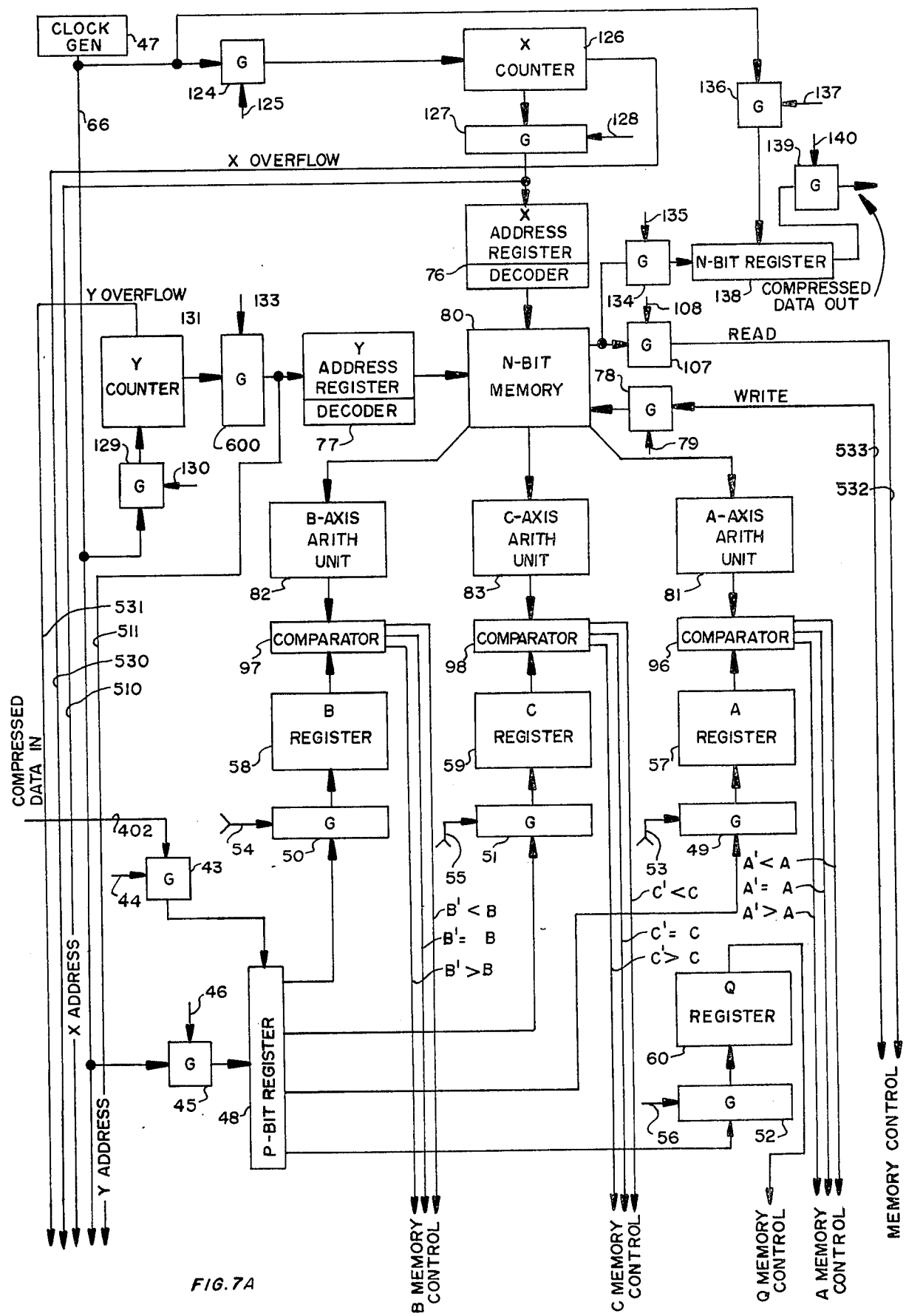
FIGS. 7A and 7B are more detailed block diagrams of the decoder of FIGS. 2A and 2B.
Figure 7B:
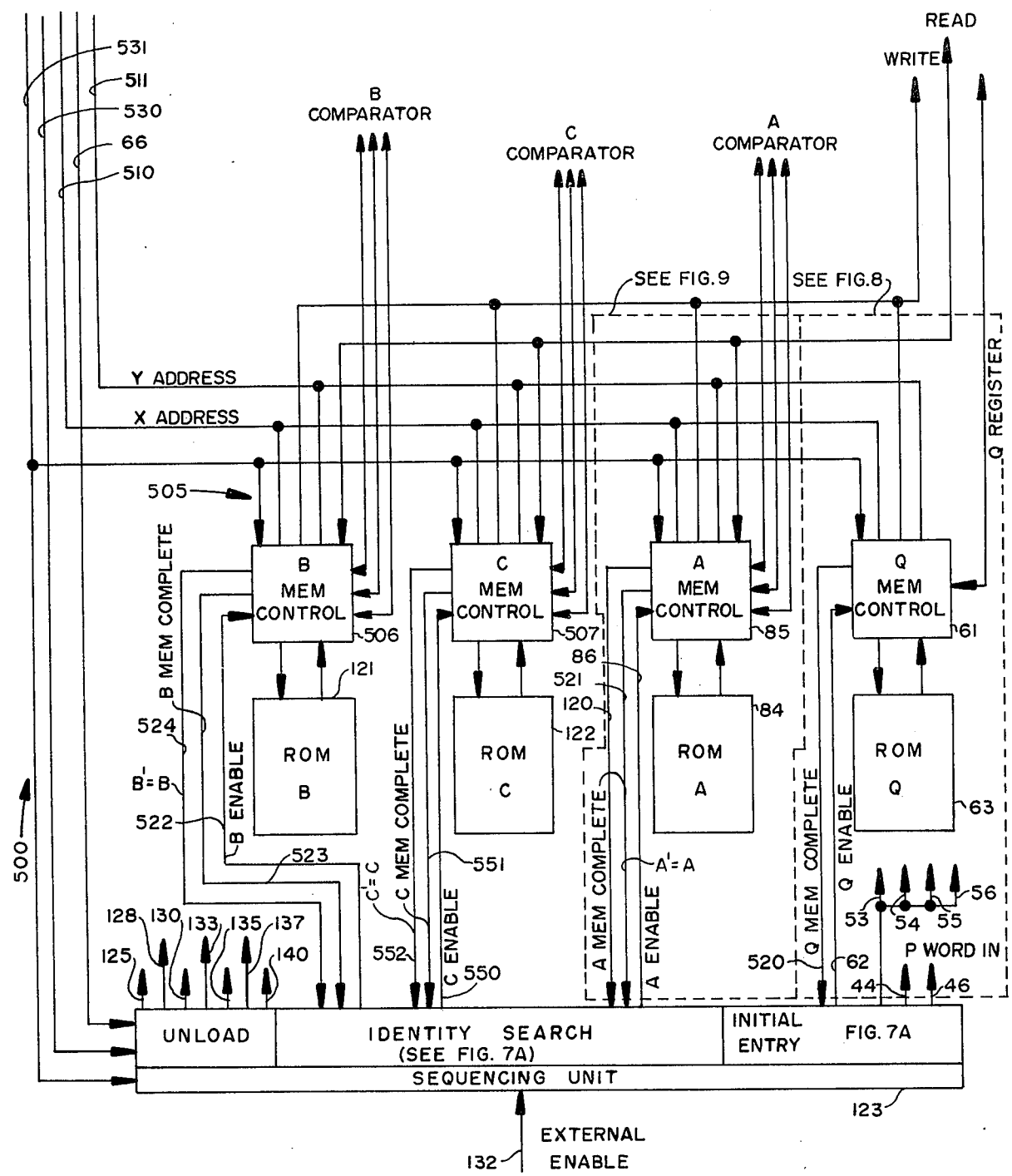

Referring to FIG. 7, there is provided in decoder 500, the previously described P-bit register 48 having an input AND gate 43 for receiving the P-bit data message from encoder 400. An AND gate 45 is coupled to a clock generator 47 by means of a line 66 and to the shift pulse input of register 48 for shifting the register. Coupled also to register 48 by means of a plurality of AND gates 49, 50, 51 and 52 are, respectively, the set of A, B, C and Q registers 57, 58, 59 and 60 for receiving the A, B, C and Q segments of the P-bit data message. Registers 57, 58 and 59 are further coupled to the previously described set of corresponding comparators 96, 97 and 98 which are, in turn, coupled to a corresponding one of the memory control circuits 505. The corresponding memory control circuits of control circuits 505 comprise a Q-memory control 61 coupled to a read-only memory Q (ROM Q) 63, an A-memory control 85 coupled to a read-only memory A (ROM A) 84, a B-memory control 506 coupled to a read-only memory B (ROM B) 121 and a C-memory control 507 coupled to a read-only memory C (ROM C) 122. Comparator 96 is coupled to a A-memory control 85 by three lines $A'<A$, $A'=A$ and $A'>A$. Comparator 97 is coupled to B-memory control 506 by three lines $B'<B$, $B'=B$ and $B'>B$. Comparator 98 is coupled to C-memory control 507 by three lines $C'<C$, $C'=C$ and $C'>C$. The memory control circuits 61, 85, 506 and 507 are also coupled in parallel through a READ AND gate 107 and a WRITE AND gate 78 to the N-bit memory 80, which is addressed along an X and Y-axis as memory 13 in FIG. 2.

Addressing of memory 80 along its X-axis or in the X direction is provided by an X-counter 126 having an input AND gate 124 and an output AND gate 127 coupled to an X-address register 76. Addressing of the memory in its Y-direction is provided by a Y-counter 131 having an input AND gate 129 and an output AND gate 600 coupled to a Y-address register 77. In addition to addressing the memory 80 by means of counters 126 and 131, there is provided, coupled to the inputs of X and Y-address registers 76 and 77, an X-address line 510 and a Y-address line 511 which are coupled in parallel to A, B, C and Q memory control circuits 61, 85, 506 and 507.

As previously described, to provide the numbers $A'$, $B'$ and $C'$ against which the numbers A, B and C are compared, there is provided, coupled to memory 80, the plurality of arithmetic units 81, 82 and 83, respectively. As described with respect to the units 26, 27 and 28 of FIG. 5, units 81, 82 and 83 are coupled to the cells of memory 80 in substantially the same fashion for summing columns of the contents of the memory in three separate and predetermined sequences. Similarly, like units 26, 27 and 28, units 81, 82 and 83 may comprise binary full and half-adder units in any of several well-known configurations. Further, units 81, 82 and 83, like units 26, 27 and 28, continuously sum the contents of their associated memory cells as the cells are loaded, and as the contents of cells are shifted to adjacent cells.

The overall operation of encoder 500 is provided under the control of a sequencing unit 124 which, as will become apparent, provides three modes of operation: an initial entry mode for loading Q-logical "one's" in memory, an identity search mode for shifting the contents of the memory 80 until the output of the arithmetic units 81, 82 and 83 equal the numbers A, B and C from the P-bit data message, and an unload mode for transferring a recreated N-bit data message to an external output device. For control purposes during the initial entry and identity search modes, the Q-memory control 61 is coupled to sequencing unit 123 by a Q-enable line 62 and a Q-memory complete line 520. The A-memory control 85 is coupled to unit 123 by an A-enable line 86, an A-memory complete line 521 and an $A'=A$ line 120. The B-memory control 506 is coupled to unit 123 by a B-enable line, 522 a B-memory complete line 523 and a $B'=B$ line 524, while the C-memory control 507 is coupled to unit 123 by a C-enable line 550 a C-memory complete line 551 and a $C'=C$ line 552. Additionally, there is, coupled to unit 123, an X-overflow line 530 from X-counter 126, a Y-overflow line 531 from Y-counter 131, an external enable signal input line 132 from encoder 400 and a plurality of output lines coupled to the above described gates for controlling the gates.

Referring to FIG. 8, the Q-memory control 61 and ROM Q 63 of FIG. 7 are shown in greater detail as having coupled to the Q-enable line 62, the set input of a FF 64. The set output of FF 64 is coupled by an AND gate 65 to the shift input of a four-stage register 67. The gate 65 is also coupled by line 66 to clock generator 47 for shifting the register. A comparator 68 is coupled to Q-register 60 and to an address counter 69, which receives its input from the first stage of register 67. An AND gate 70 is coupled to the counter 69, the second stage of register 67, and, through an address register 71, to decoder 72 for addressing the ROM Q memory 63. ROM Q 63 is organized to store N-words corresponding to N X and Y-address in memory 80. X and Y-address words addressed in ROM Q by register 71 are transferred to a word register 73 and, through a pair of AND gates 74 and 75, coupled also to the third stage of register 67 to X and Y-address registers 76 and 77, respectively. The fourth stage of register 67 is coupled by a line 79 to the WRITE gate 78 for enabling the gate and storing a bit in the memory and by an end-around line for setting the first stage of the register. Comparator 68 is further coupled by a reset line to register 67 and to the reset input of FF 64 for resetting of these circuits and, by the Q-memory complete line 520, to the sequencing unit 123 for indicating initial entry of Q-logical "one's" in memory 80.

The ROM Q 63, instead of a simple counter, is used for addressing memory 80 to provide flexibility in storing the Q-logical "one's" in the memory such that advantage can be taken during decoding of certain statistical information which may be known of the original N-bit data message. Thus, if there are — and there always will be in non-trivial cases — less than N logical "one's" — i.e., when Q is less than N — the "one" bits may be stored in memory 80 in accordance with a predetermined algorithm rather than sequentially or randomly to obtain a closer recreation of the original N-bit data message.

Once the memory 80 is loaded with Q logical "one's", control of decoder 500 is taken up by the identity search mode portion of sequencing unit 123. During this mode, the A, B and C-memory control circuits 85, 506 and 507 are employed. Each of the circuits 85, 506 and 507 are identical though coupled respectively to comparator circuits 96, 97 and 98 to control the generation of the numbers A', B' and C'. Consequently, the description of memory control circuit 85 and ROM A 84 applies equally to the B and C-memory control circuits 506 and 507 and ROM B 121 and ROM C 122.

To initiate the identity search, the A-enable line 86, coupled to sequencing unit 123, is coupled to the set input of a FF 87. The set output of FF 87 is coupled to enable an AND gate 88 to pass clock pulses from generator 47 to the shift input of a 9-stage shift register 89 for shifting the register. Register 89 controls the operation of A-memory control 85. The first stage of register 89 is coupled to an address counter 90 for incrementing register 92. Coupled to the counter 90 and the second stage of register 89 is an AND gate 91. Gate 91 passes the contents of the counter 90 to an address register 92 for decoding in a decoder 93 to address the ROM A 84. As will be described in more detail below, each word addressed in ROM A 84 comprises a pair of addresses for addressing memory 80. Coupled to ROM 84 is a pair of word registers 94 and 95. One of the address pairs, conveniently called Word No. Left, is sent from ROM A 84 to the Word register 94. The second of the address pairs, conveniently called Word No. Right, is sent to the Word register 95. A first pair of AND gates 115 and 116 is coupled to register 94. A second pair of AND gates 555 and 556 is coupled to register 95. Gates 555 and 115 are, in turn, coupled in parallel to X-address register 76 and gates 556 and 116 are coupled in parallel to Y-address register 77.

To selectively enable gates 555, 556, 115 and 116, there is provided a first plurality of AND gates 102, 103 and 104 coupled to the third and eighth stages of register 89, and a second plurality of AND gates 112 and 113 coupled to the fifth stage of register 89. To enable these gates, there are provided three flip-flops 99, 100 and 101. The set input of FF 99 is coupled to the A'<A output of comparator 96 and its set output line is coupled to gates 112 and 102. The set input of FF 100 is coupled to the A'=A output of comparator 96 and its set output is coupled to gate 103. The set input of FF 101 is coupled to the A'>A output of comparator 96 and its set output line is coupled to gates 104 and 113. The outputs of gates 102 and 113 are, in turn, coupled to gates 555 and 556, while the outputs of gates 104 and 112 are coupled to gates 115 and 116. The output of gate 103, which provides the A'=A signal, is coupled to sequencing unit 123 by the line 120 for providing the A'=A signal to that unit, through an OR gate 111 to register 89 for resetting the register 89, through an OR gate 119 to FF 87 for resetting the FF 87, providing the memory complete signal on the line 521 coupled to sequencing unit 123 and to the rest inputs of FF 99, 100 and 101 for resetting the flip-flops.

Coupled also to the fourth and sixth stages of register 89 is an OR gate 560. Gate 560 is coupled via a line 108 to Read gate 107. By means of a pair of lines 110 and 118, the fourth and sixth stages are also coupled to a pair of AND gates 109 and 117, which are coupled via the line 532 to the Read line output of Read gate 107 for reading, respectively, a logical "one" and a logical "zero." The gates 109 and 117 are also coupled to OR gate 111 for resetting register 89. Similarly, the seventh and ninth stages of register 89 are coupled through an OR gate 561 to the Write gate 78 by means of a line 79, and to the Write input line of gate 78 for writing in memory a logical "one" and logical "zero," respectively.

Figure 10A:
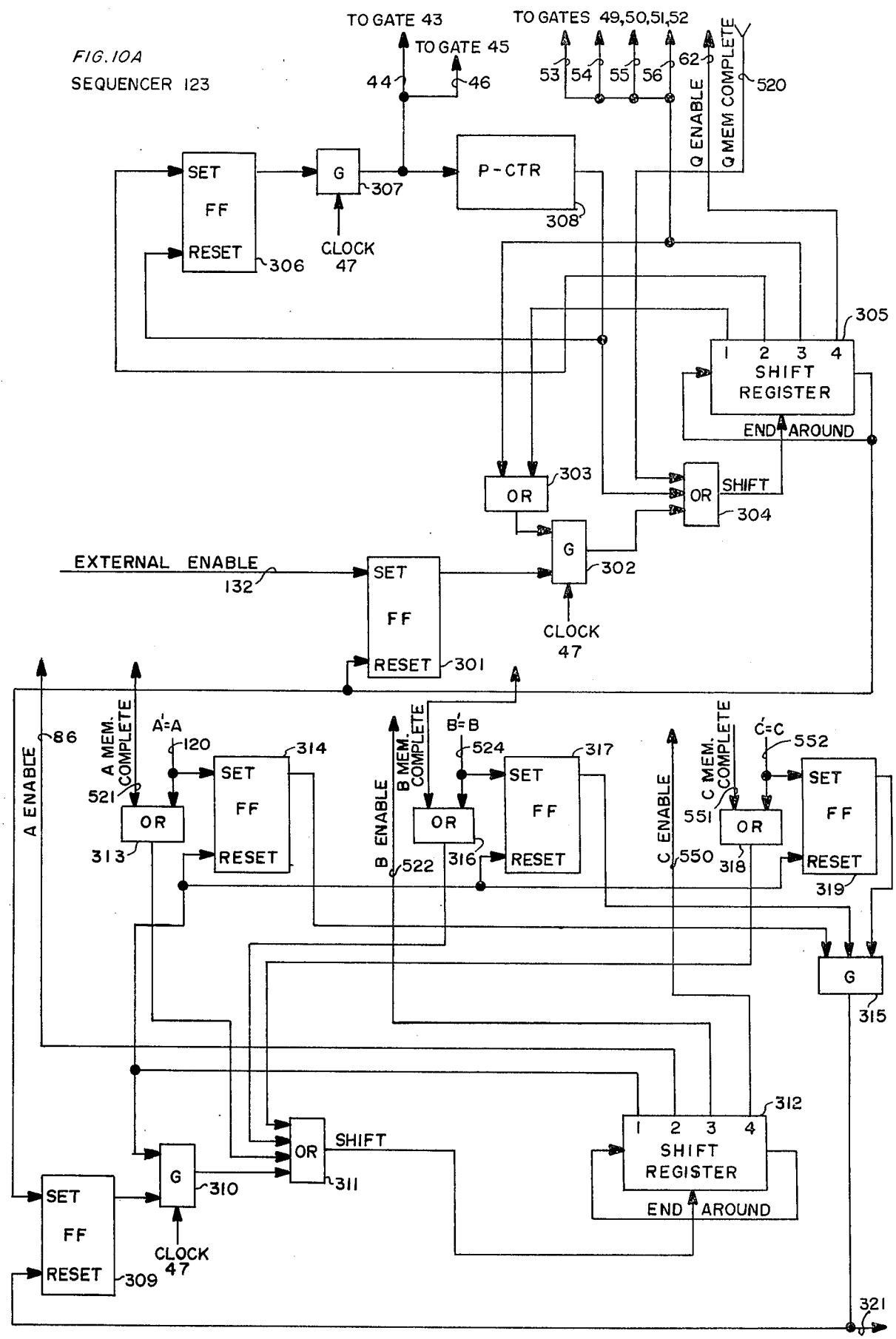
FIGS. 10A and 10B are detailed block diagrams of the sequencing unit of FIG. 7B.
Figure 10B:
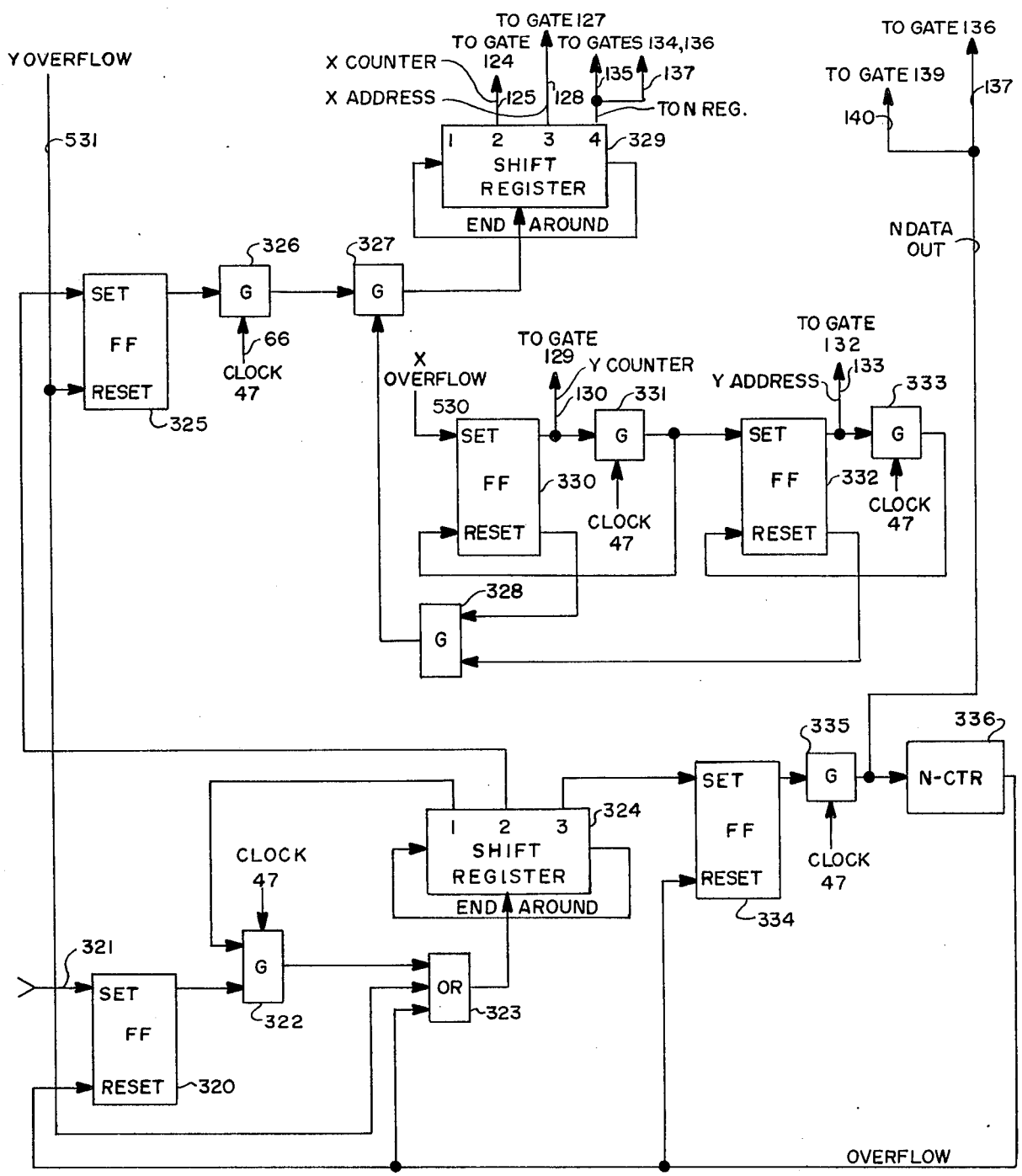

Referring to FIG. 10, as previously a sequencing unit 123 of decoder 500 provides control signals for the operation of the decoder in three modes: an initial entry mode, an identity search mode and an unload mode.

For the initial entry mode, the line 132 carrying the external enable signal is coupled to the set input of a FF 301. The set output of FF 301 is coupled through an AND gate 302 and an OR gate 304 to the shift input of a four-stage shift register 305. The first and fourth stages of register 305 are coupled through an OR gate 303 to the gate 302. Gate 302 is also coupled to the clock generator 47. The second stage of register 305 is coupled to the set input of a FF 306. The set output of FF 306 is coupled through an AND gate 307 to a P-counter 308 having P bit stages and to gates 43 and 45 by a pair of lines 44 and 46 for controlling the gates. The last stage of counter 308 is coupled to the reset input of FF 306 and, through OR gate 304, to the shift input of register 305 to shift the register. The third stage of register 305 is coupled to OR gate 303 and to the gates 49, 50, 51 by lines 53, 54, 55 and 56, respectively. The fourth stage of register 305 is coupled to line 62 for providing the Q-enaable signal. The Q-memory complete signal from Q-memory control 61 is carried on the line 520, which is coupled to OR gate 304. The last stage of register 305 is also coupled to the first stage by an end-around line for presetting the first stage, to the reset input of FF 301 for resetting the flip-flop and to the set input of a FF 309 for initiating the identity search mode.

The set output of FF 309 in the identity search section of sequencing unit 123 is coupled to the shift input of a four-stage shift register 312 through an AND gate 310 and an OR gate 311. The first stage of register 312 is coupled to the shift input of the register through gates 310 and 311 and to the reset inputs of a FF 314, a FF 317 and a FF 319 for resetting the flip-flops. The set input of FF 314 is coupled to the $A'=A$ line 120. The $A'=A$ line 120 and the A-memory complete line 521 are also coupled to the shift input of register 311 through an OR gate 313 and the OR gate 311. The second stage of register 312 is coupled to the A-enable line 86 for enabling the A-memory control circuit 85. The third stage of register 312 is coupled to the B-enable line 512 for enabling the B-memory control circuit 506. The fourth stage of register 312 is coupled to the C-enable line 550 for enabling the C-memory control circuit 507 and by an END-AROUND line to the first stage of the register for presetting the first stage. The $B'=B$ line 524 is coupled to the set input of FF 317 and, together with the B-memory complete line 523, to the shift input of register 312 through an OR gate 316 and the OR gate 311. Similarly, the $C'=C$ line 552 is coupled to the set input of FF 319 and, together with the C-memory complete line 551 to the shift input of register 312 through an OR gate 318 and the OR gate 311. The set outputs of each of FF 314, 317 and 319 are, in turn, coupled to an AND gate 315. The output of AND gate 315 is coupled to the reset input of the FF 309 for resetting the FF 309 and to the set input of a FF 320 for initiating the unloading mode.

The unloading of memory 80, upon completion of the identity search mode and recreation of the original N-bit message, requires substantially the same apparatus as is provided in the encoder for loading memory 13. Accordingly, the set output of FF 320 is coupled to the shift input of a three-stage shift register 324 through an AND gate 322 and an OR gate 323. The first stage of register 324 is coupled also to its shift input through the gates 322 and 323. The second stage of register 324 is coupled to the set input of a FF 325. The Y-overflow line 530 from Y-counter 131 is coupled to the reset input of FF 325 and through the OR gate 323 to the shift input of register 324. The set output of FF 325 is coupled through an AND gate 326 and an AND gate 327 to the shift input of a four-stage shift register 329. The second stage of register 329 is coupled to gate 124 by the line 125. The third stage of register 329 is coupled to gate 127 by the line 128 and the fourth stage of register 329 is coupled to gates 134 and 136 by the lines 135 and 137 and by an end-around line to the first stage.

To increment the Y-address register 77, the X-overflow line 530 is coupled to the set input of a FF 330. The set output of FF 330 is coupled to the gate 129 by a line 130 and through an AND gate 331 to its reset input and the set input of a FF 332. The set output of FF 332 is coupled to the gate 132 by a line 133 and through an AND gate 333 to its reset input. Each of gates 326, 331 and 333 is also coupled to clock generator 47. The reset outputs of FF 330 and 322 are coupled to an AND gate 328 which is, in turn, coupled to AND gate 327 for controlling the shifting of register 329 by the clock pulses from gate 326. The third stage of register 324 is coupled to the set input of a FF 334 and by an end-around line to its first stage for pre-setting the first stage. The set output of FF 334 is coupled through an AND gate 335 to gates 136 and 139 by a pair of lines 137 and 140 and to an N-counter 336. Gate 335 also receives an input from clock generator 47 for advancing the N-counter 336. The output of N-counter 336 is coupled by an overflow line to the shift input of register 324 through OR gate 323 and to the reset inputs of FF 334 and 320 for resetting the flip-flops.

In operation, the decoder 500 undergoes three sequences in decoding the P-bit data message received from the encoder 400: an initial entry sequence, an identity search sequence and an unloading sequence. The initial entry sequence is initiated upon receipt of an external enable signal in line 132 which sets the FF 301 (FIG. 10). The external enable signal may be generated by the encoder or some other external apparatus and simply indicates that a P-bit word is available for decoding. The setting of FF 301 enables gate 302 to pass clock pulses which shift register 305 from its first stage to its second stage, setting FF 306. The setting of FF 306 enables gate 307. The enabling of gate 307 enables gates 43 and 45 (FIG. 7), allowing a P-bit data message to enter on line 402 into P-register 48. After P clocks, gates 49–52 are enabled by the shifting of register 305 to its third stage causing the A, B, C and Q segments of the P-bit data message to be transferred from register 48 to A, B, C and Q registers 57–60, respectively. Registers 57–60 provide one input to comparators 96–98. The other input to comparators 96–98 is supplied by arithmetic units 81–83, respectively. The signal enabling gates 49–52 also enables gate 302, which permits clock signal 47 to shift register 305 to its fourth stage for generating a Q-enable signal on line 62.

Referring to FIG. 8, the contents of the Q-register 60 are applied to one input of the comparator 68 and the Q-enable signal sets the FF 64. The setting of FF 64 initiates incrementing of the register 67 which, in turn, increments address counter 69 and address register 71 for addressing the ROM Q 63. ROM Q 63 contains N memory locations or words designated $W_1, W_2 \ldots W_N$. Each word in the ROM comprises an X and Y address pair of the decoder N-bit memory 80. In its simplest implementation, the addresses are placed in ROM Q 63 in random order. Alternatively, they can be arranged in other orders for more sophisticated algorithms leading to a more efficient utilization of decoder time in cases where statistical information is available to predict characteristics of the N-bit data message sougth to be recreated.

Accordingly, as each ROM Q 63 word is addressed, an X and Y address of memory 80 is transferred to address registers 76 and 77 of the memory 80 and a logical "one" bit stored thereat. The sequential addressing of the ROM Q 63 and the storing of logical "one" bits continue in this fashion until such time as the contents of the counter 69 equal the contents of Q-register 60. When the contents of counter 69 and register 60 are equal, Q "one's" have been stored in memory 80. At that time comparator 68 outputs a signal resetting FF 64 and register 67, and generates a Q-memory complete signal on line 520, shifting register 305 to set FF 309 (FIG. 10).

The setting of FF 309 initiates the identity search sequence. During the identity search sequence, the arithmetic units 81-83 continuously sum, in three predetermined sequences, columns of the contents of memory 80 stored during the initial entry sequence for generating three sums A', B' and C'. The three predetermined sequences in which the sums A', B' and C' are generated correspond to the sequences used in generating the sums A, B and C in the encoder. As the sums A', B' and C' are generated, they are continuously compared by means of comparators 96-97 with the numbers A, B and C in registers 57-59. Depending on the relationship between the numbers compared, the comparators will output a signal corresponding to A'=A, A'<A or A'λ>A; B'=B, B'<B or B'>B; and C'=C, C'<C or C'>C. These signals are used to control the operation of the A, B and C memory control circuits 85, 506 and 507 and their associated ROM's 84, 121 and 122, respectively.

The function of memory control circuits 85, 506 and 507 is to shift the "one" bits in memory 80 in response to the outputs from comparators 96-98 until such time as the numbers A'=A, B'=B and C'=C. The shifting may be either right or left depending on the relationship between the numbers being compared at a given time. Whether the shifting is right or left depends on whether the primed number is greater than or less than the unprimed number. Thus, if the primed number is greater than the unprimed number, the shifting is to the right to reduce the value of the primed number. In the present embodiment, the most significant bits are shifted first, if possible, to achieve the most significant change in the value of the primed numbers, and this operation is carried on successively with each prime number in a cyclical fashion until equality is achieved between all the primed and corresponding unprimed numbers.

To provide the right and left shifting of bits in memory 80, each of the ROM's 84, 121 and 122 is provided with N word locations for containing N pairs of addresses of memory 80. Each word location comprises two parts designated Word No. Left and Word No. Right. For ROM A 84, shifting is along or parallel to the A-axis (FIG. 3). Similarly, for ROM B 121 and ROM C 122, shifting is along or parallel to the B and C axes, respectively. For example, for the N=16 example shown in FIGS. 3 and 4, the address pairs for the ROM's are as follows:

| ROM A Address | Word No. Left | Memory 80 Address | Word No. Right | Memory 80 Address |
|---|---|---|---|---|
| 1 | W 1,1 | 0,3 | W 1,2 | 1,2 |
| 2 | W 2,1 | 0,2 | W 2,2 | 1,1 |
| 3 | W 3,1 | 1,3 | W 3,2 | 2,2 |
| 4 | W 4,1 | 0,1 | W 4,2 | 1,0 |
| 5 | W 5,1 | 1,2 | W 5,2 | 2,1 |
| 6 | W 6,1 | 2,3 | W 6,2 | 3,2 |
| ..... | | | | |
| 16 | W16,1 | 2,1 | W16,2 | 3,0 |

| ROM B Address | Word No. Left | Memory 80 Address | Word No. Right | Memory 80 Address |
|---|---|---|---|---|
| 1 | W 1,1 | 0,0 | W 1,2 | 1,1 |
| 2 | W 2,1 | 1,0 | W 2,2 | 2,1 |
| 3 | W 3,1 | 0,1 | W 3,2 | 1,2 |
| ..... | | | | |
| 16 | W16,1 | 2,2 | W16,2 | 3,3 |

| ROM C Address | Word No. Left | Memory 80 Address | Word No. Right | Memory 80 Address |
|---|---|---|---|---|
| 1 | W 1,1 | 3,3 | W 1,2 | 3,2 |
| 2 | W 2,1 | 2,3 | W 2,2 | 2,2 |
| 3 | W 3,1 | 1,3 | W 3,2 | 1,2 |
| ..... | | | | |
| 16 | W16,1 | 0,1 | W16,2 | 0,0 |

Thus, for example, when the first word of ROM A is addressed, the word comprising Word No. Left W 1,1 containing memory 80 address 0,3 and Word No. Right W 1,2 containing memory 80 address 1,2 is selected. As will be apparent, if A' is larger than A, a "one" bit in the most significant memory 80 location 0,3 as regards the A-axis sum will be shifted to the right one memory cell location to memory 80 location 1,2, if the locaton 1,2 is a logical "zero." If at location 0,3 there is no "one" or if at location 1,2 there is not a "zero," the shift is not possible. In that event, the addresses at ROM A address 2 are checked and so on, until a shift is made along the A-axis or it is determined that no shift is possible. Thereafter, control transfers successively to B and C memory control circuits 506 and 507 for a shifting of logical "ones" along their respective axes as required. The checking and shifting thus progresses cyclically through A, B and C axes shifts. Since each of the ROM memory control circuits and associated ROM's is identical in structure and operation, only the operation of A-memory control circuit 85 and ROM A 84 need be described in detail.

Figure 9:
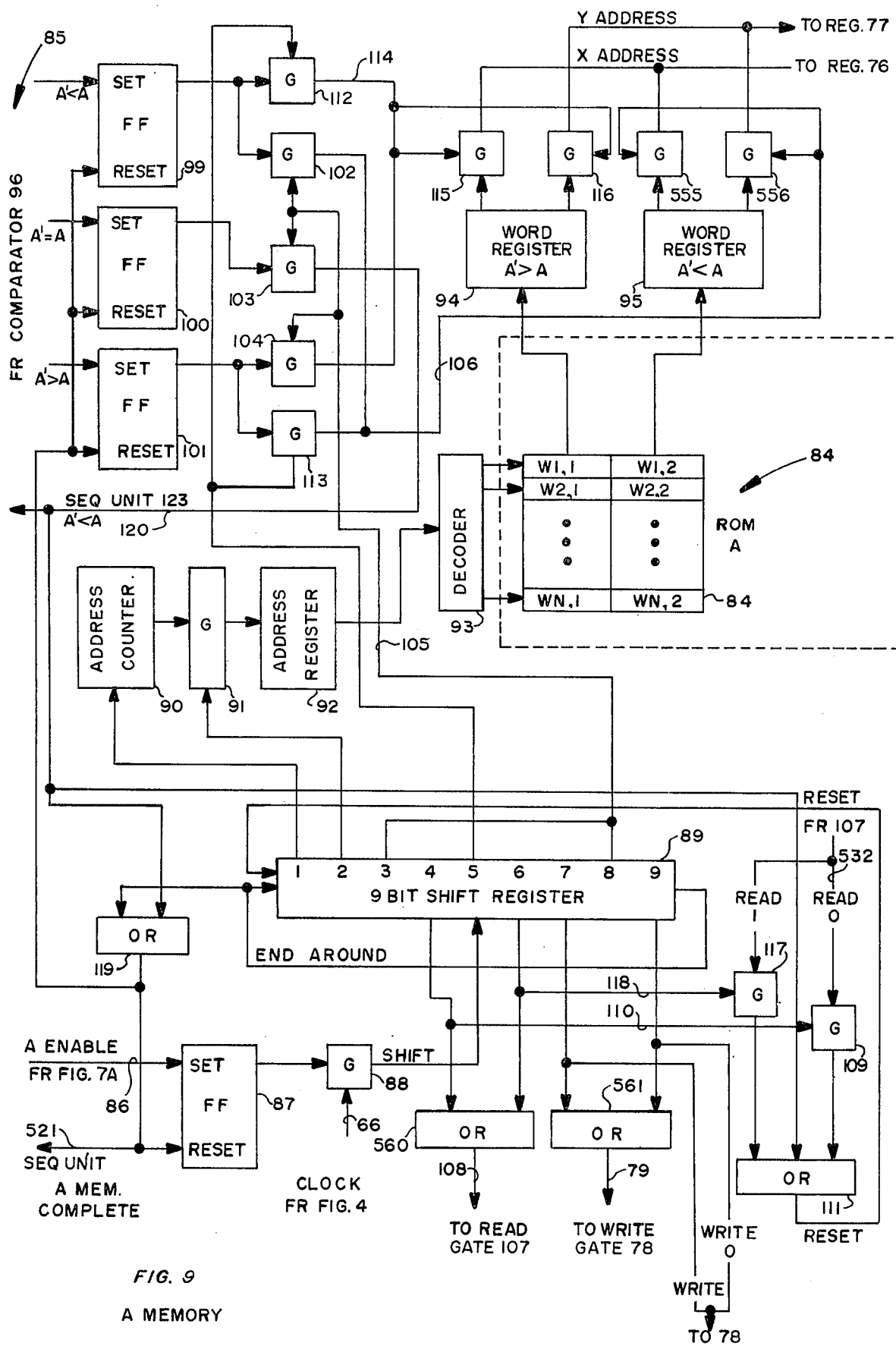
FIG. 9 is a more detailed block diagram of the A Memory Control circuit and ROM A of FIG. 7B.

Referring to FIGS. 9 and 10, the setting of FF 309 effects a shifting of register 312 from its first to its second stage, resulting in the generation of an A-enable signal on the line 86, which is coupled to and sets FF 87. The setting of FF 87 and resulting advancement of register 89 operate to select and transfer the first word comprising Word No. W 1,1 containing X and Y addresses 0,3 and Word No. Right W 1,2 containing X and Y addresses 1,2 to word registers 94 and 95, respectively. As previously indicated, comparator 96 operates to produce a greater than, less than, or equal to output on one of its three output lines as a function of the inputs from A-axis arithmetic unit 81 and A register 57 to one of the three FF 99, 100 or 101. As shift register 89 enters stage 3, gates 102, 103 and 104 are interrogated by line 105. If A' is less than A, FF 99 enables gate 102 and, by a signal on line 106, enables gates 107 and 108, permitting transmission of the contents of word register 95, with left half-word going to the X-address line, and right half-word going to the Y-address line to enter registers 76 and 77, respectively.

In the N=16 example, if W 1,1 - 1,2 is addressed in ROM A 84, word register 94 will contain X, Y address pair 0,3 and register 95 will contain address pair 1,2. If A' is less than A, address 1,2 is transmitted to register 76 and 77. Shift register 89 is then shifted to its fourth stage. Stage 4 of shift register 89 enables read gate 107 through line 108 and gate 109 through line 110. If a logical "zero" is read at this bit cell location, it will be seen that a 1-to-0 left shift in the increasing A-axis direction is not possible, and the output through OR gate 111 will reset shift register 89 to stage 1, causing the address counter 90 to be incremented and the trial process to commence again on a subsequent cycle at address 2 of ROM A 84. If, however, a logical "one" was read, the reset does not occur and the shifting process continues with the shift register 89 entering its stage 5. This will cause interrogation of gates 112 and 113. Since A' is less than A, a signal on line 114 will enable gates 115 and 116, permitting the 0,3 address contained in word register 94 to pass to registers 76 and 77, selecting this bit cell in memory 80. When shift register 89 passes to stage 6, line 108 again enables gate 107 and also gate 117 through line 118. If the output of memory 80 is a logical "one," this will indicate that an increasing A-axis shift to the left is not possible for this cell pair, causing gate 111 to output and cause shift register 89 to reset and thus try the next cell pair on a subsequent cycle. If, however, the output was logical "zero," the shifting process continues. When shift register 89 enters stage 7, WRITE gate 78 is enabled through line 79 and a logical "one" is written in cell 0,3 of memory 80. When register 89 enters stage 8, gate 102 is again interrogated and line 106 causes address 1,2 to be transmitted once again through gates 107 and 108 from word register 95 to registers 76 and 77. Stage 9 of register 89 then enables gate 78 through line 79 and causes a logical "zero" to be written in cell 1,2 thus completing the shift on the A-axis. At that time, the end-around output from register 89 resets register 89 to stage 1, and operates OR gate 119, whose output resets FF 87, 99, 100 and 101. There is also generated an A-memory complete signal for shifting register 312 in sequencing unit 123, thus completing an operation cycle of ROM A 84.

If, on the other hand, A' is greater than A, FF 101 enables gate 104 and, by line 114, enables gates 115 and 116 for transferring the contents of word register 94, with the left half-word going to the X-address line and the right half-word going to the Y-address line to enter registers 76 and 77, respectively.

In the N=16 example, if, as before W 1,1 - 1,2 is addressed in ROM A 84, word register 94 will contain X, Y address pair 0,3 and register 95 will contain address pair 1,2. Then address 0,3 will be transmitted to registers 76 and 77. Stage 4 of shift register 89 will enable READ gate 107 through line 108 and also enable gate 109 through line 110. If a logical "zero" is read at this 0,3 bit cell location, it will be seen that a 1-to-0 shift in the decreasing A-axis direction — i.e., from 0,3 to 1,2 — is not possible, and an output through OR gate 111 will reset shift register 89 to stage 1, causing address counter 90 to be incremented again, and the shifting process to commence again at address 2 of ROM A 84. If, however, a logical "one" was read at cell 0,3 the reset does not occur and the shifting process continues with shift register 89 entering stage 5. This will cause an interrogation of gates 112 and 113. Since A' is greater than A, line 106 will enable gates 107 and 108, permitting the 1,2 address contained in word register 95 to pass to register 76 and 77 selecting bit cell 1,2 in memory 80. When shift register 89 passes to stage 6, line 108 again enables gate 117 through line 118 to read the cell. If the output of cell 1,2 of memory 80 is a logical "one," the A-axis right shift is not possible for this cell pair. This will enable gate 111 to cause shift register 89 to reset and thus try the next address pair at address 3 of ROM A 84. If, however, the output of cell 1,2 is a logical "zero," the shifting process continues. When shift register 89 enters stage 7, WRITE gate 78 is enabled through line 79 and a logical "one" is written in cell 1,2 of memory 80. When register 89 enters stage 8, gate 104 is again interrogated and line 114 causes address 0,3 again to be transmitted through gates 115 and 116 from word register 94 to registers 76 and 77. Stage 9 of shift register 89 then enables gate 78 through line 79 and causes a logical "zero" to be written in cell 0,3. Additionally, the end-round output from register 89 resets this register to stage 1, and operates OR gate 119, whose output resets FF 87, 99, 100 and 101, and transmits the signal A-memory complete to sequencing unit 123, thus completing the shift in the decreasing direction on the A-axis of memory 80.

If, as in the third possibility, A' had been equal to A, stage 3 of register 89 would have interrogated gate 103 and line 120 would have operated gate 111 to reset register 89 and gate 119 to reset FF 87, 99, 100, and 101, and also send an "equal" output signal to sequencing unit 123.

After ROM A has been cycled as described, ROM B 121 and ROM C 122 are successively cycled in the same manner. After repeated sequential cycling of ROM A, B and C, a state will be reached in which A' equals A, B' equals B and C' equals C simultaneously. The contents of memory 80 are then assumed to be the same as the original N-bit data word which was entered into the encoder unit. This completes the identity search process, and sequencing unit 123 now enters the unload sequence.

The unload sequence controlled by sequence unit 123 is very similar to the load process described for the encoder unit. Gate 124 is enabled through line 125, which permits a clock from clock generator 47 to increment X-counter 126 by one, and after each clock has entered the X-counter, gate 124 is disabled and gate 127 enabled through line 128, permitting counter contents to enter X-address register 76. This enables one address line in the X direction of memory 80. Gate 129 is enabled through line 130 and, when X-counter 126 overflows, Y-counter 131 will be incremented by one. Then gate 132 will be enabled by line 133 and counter contents will pass to Y-address register 77. Each address O through N of memory 80 will be sequentially selected in this manner. As each address is selected, gate 134 will be enabled by line 135, permitting selected bit cell contents to enter N-bit register 138. Also gate 136 will be enabled by line 137 permitting a shift clock to enter from clock generator 47. After N such cycles, the N-bit register 138 will contain contents of memory 80 and the memory state will be all "xeros," in readiness for the succeeding initial entry process. Gate 139 can be armed by line 140, and gate 136 can be armed by line 137 to permit contents of register 138 to be shifted out of decoder unit at any convenient time during the succeeding decode process cycle.

In the operation of the decoder sequencing unit 123, the external enable signal starts each decode cycle. This signal sets FF 301, which enables one input to AND gate 302. Shift register 305 is initially in stage 1, which enables OR gate 303, which enables the other input of AND gate 302, permitting a clock from generator 47 to pass to OR gate 304, which generates a shift pulse to register 305. When this register enters stage 2, it sets FF 306, which enables gate 307. Then P clocks enter P-counter 308 and also enable lines 44 and 46 of FIG. 7. After P counts the end-around signal from counter 308 resets FF 306 and enables OR gate 304 to provide a shift clock to shift register 305, which transfers to stage 3. This stage enables lines 53, 54, 55 and 56 and also enables OR gate 303, which enables AND gate 302, which transmits output to OR gate 304, providing a shift clock to transfer shift register 305 to stage 4. This stage enables the Q-memory control. When Q-memory process has been completed, as described previously, Q-memory complete signal operates OR gate 304 to transfer shift register 305 to stage 1, which also resets FF 301 and sets FF 309 to complete the initial entry procedure, and start the identity search procedure.

At the start of the identity search FF 309 enables one input of AND gate 310 whose output goes to OR gate 311, whose output, in turn, provides shift clocks to shift register 312. This register initially is in stage 1. AND gate 310 and OR gate 311 provide a shift clock to cause register 312 to enter stage 2. In this stage, an A-enable line 86 is operated. When the A-memory cycle is complete, as described previously, the A-memory control will provide an output either A-memory complete or A'=A. Either of these outputs will enable OR gate 313. If A-memory complete occurs, shift register 312 will be advanced to stage 3. If A'=A occurs, the register also will be advanced, and, in addition, FF 314 will be set and will provide an input to AND gate 315. Next, stage 3 of shift register 312 will drive B-enable line, and OR gate 316 will respond to either a B-memory complete or B'=B signal. In the case of B-memory complete, register 312 will be transferred to stage 4. In the case of B'=B, this will also occur, and FF 317 will be set to provide a second input to AND gate 315. In stage 4, register 312 will operate the C-enable line and either a C-memory complete or C'=C signal will be returned through OR gate 318. IF a C'=C signal occurs, FF 319 will be set, with an input to AND gate 315.

The cycling of register 312 will be repeated with the register returning to stage 1 after each trial, and resetting FF 314, 317 and 319 until such time as all three outputs indicate simultaneously A'=A, B'=B, and C'=C. At this time AND gate 315 will be enabled. The enabling of gate 315 resets FF 309 and sets FF 320, which completes the identity search process and starts the unload process.

At the start of the unload sequence, line 321 sets FF 320, which enables one input of AND gate 322, whose output enables OR gate 323. This provides a shift clock to register 324, which transfers to stage 2. This stage sets FF 325, which enables gate 326, permitting clocks from generator 47 to pass to gate 327. This gate is enabled by AND gate 328, permitting shift clocks to pass register 329. When this register enters stage 2, it enables line 125. Stage 3 enables line 127, and stage 4 enables lines 135 and 137. This register continues to operate until X-overflow occurs, at which time the X-overflow signal sets FF 330, which enables gate 331 and line 130. The next clock from generator 47 resets FF 330 and sets FF 332. This output enables line 133 and enables gate 333. The next clock from generator 47 resets FF 332. Now that FF 330 and 332 are both reset, the inputs to AND gate 328 enables gate 327, permitting continuation of the cycle. This continues until Y-overflow occurs, at which time FF 325 is reset, and shift register 324 is transferred to stage 3. At this time, FF 334 is set, which enables gate 335, and sets lines 137 and 140. Gate 335 permits clocks from generator 47 to pass to N-counter 336. After N clocks, this counter overflows and this signal resets FF 320, transfers SR 324 to stage 1, and resets FF 334. This brings the decoder sequencing unit into a state of readiness for the next external enable input signal.

While having described an embodiment of the present invention in terms of conventional AND gates, OR gates, flip-flops, registers and memories, it is understood that other and more sophisticated circuit elements may be used and that the use of such other elements which are the equivalent thereof will be within the spirit and scope of the present invention. Moreover, it is considered well within the the skill of the art to couple the circuit elements described, such as the arithmetic units and their respective memories, in other ways so as to sum columns of the contents of the memories in other orders than those described.

Accordingly, it is intended that the embodiment described by used only for purposes of illustration and that the scope of the invention be limited only by the claims hereinafter provided and their equivalents.

What is claimed is:

1. A data compression apparatus comprising:
  a first memory means having a plurality of memory cells;
  means for storing an N-bit data message in said first memory means, where N is the number of bits in said N-bit data message;
  means for providing a number Q corresponding to the total number of logical "one's" in said N-bit data message irrespective of their position in said first memory means;
  means coupled to said memory cells in a first predetermined order for providing a number A corresponding to the total number of logical "one's" stored in said first memory means according to a first predetermined sequence;
  means coupled to said memory cells in a second predetermined order which is different from said first predetermined order for providing a number B corresponding to the total number of logical "one's" stored in said first memory means according to a second predetermined sequence;
  means coupled to said memory cells in a third predetermined order which is different from both said first and said second predetermined order for providing a number C corresponding to the total number of logical "one's" stored in said first memory according to a third predetermined sequence;
  means for providing a P-bit message having an A, B, C and Q segment corresponding to said numbers A, B, C and Q, respectively, where P is the number of bits in said P-bits message;
  a second memory means responsive to said Q segment of said P-bit data message for storing Q logical "one's" in said second memory means;
  means for providing a number A' corresponding to the total number of logical "one's" stored in said second memory means according to a first predetermined sequence;
  means for providing a number B' corresponding to the total number of logical "one's" stored in said second memory means according to a second predetermined sequence;
  means for providing a number C' corresponding to the total number of logical "one's" stored in said second memory means in a third predetermined sequence;
  means for comparing predetermined pairs of said numbers, A' and A, B' and B and C' and C, said comparing means including means for providing an output signal corresponding to the numerical relationship between each of said pairs; and
  means responsive to said output signal, in the event said numerical relationship is one of inequality, for reordering the position of logical "one's" in said second memory means until said numerical relationship between each of said number pairs is one of equality.

2. An apparatus according to claim 1 wherein said means for providing said numbers A, B, C, A', B' and C' comprises an arithmetic means.

3. An apparatus according to claim 2 wherein said means for providing said number Q is a "one's" detector.

4. An apparatus according to claim 1 wherein said means for providing said numbers, A, B, C, A', B' and C' comprises a plurality of arithmetic units each having a plurality of input lines and said first and said second memory means each comprises a plurality of memory cells and further comprising means for coupling corresponding ones of said input lines of said plurality of arithmetic units to predetermined ones of said plurality of memory cells in said first and said second memories in accordance with said first, said second and said third predetermined sequences.

5. An apparatus according to claim 4 wherein said first and said second memory means each comprises an A-axis, a B-axis and a C-axis, and said numbers A' and A, B' and B and C' and C comprise numbers corresponding to the sum of the total number of logical "one's" stored in said first and said second memory means relative to said A-axis, said B-axis and said C-axis, respectively.

6. An apparatus according to claim 5 wherein a predetermined number of said arithmetic units are coupled to said second memory means and further comprising register means for storing said A, said B and said C segments of said P-bit data message and wherein said comparing means is coupled between said arithmetic units coupled to said second memory means and said register means for providing said comparison between said number pairs A' and A, B' and B and C' and C.

7. An apparatus according to claim 6 wherein said means for reordering the position of logical "one's" in said second memory means comprises means for increasing the numerical value of A' relative to A if A' is less than A, increasing the numerical value of B' relative to B if B' is less than B, increasing the numerical value of C' if C' is less than C, decreasing the numerical value of A' if A' is greater than A, decreasing the numerical value of B' if B' is greater than B and decreasing the numerical value of C' if C' is greater than C.

8. An apparatus according to claim 7 wherein said means for increasing and decreasing the numerical value of A', B' and C' relative to A, B and C, respectively, comprises means for shifting predetermined ones of said logical "one's" in said second memory means left and right relative to said A-axis, said B-axis and said C-axis, respectively.

9. An apparatus according to claim 8 wherein said means for shifting said logical "one's" in said second memory means includes means for interrogating a pair of adjacent memory cells in said second memory, said interrogating means including means for determining whether it is possible to shift a logical "one" from a first one of said adjacent cells to the second one of said adjacent cells without changing the total number of logical "one's" stored in said second memory.

10. A data compression apparatus comprising:
an encoding means;
a first memory means in said encoding means having a plurality of memory cells for storing data bits;
means for storing an N-bit data message in said memory cells of said first memory means where N is the number of data bits in said N-bit data message;
means coupled to said storing means for counting and generating a number Q corresponding to the number of logical "one's" in said N-bit data message;
means, including first means coupled to said memory cells in a first predetermined order, second means coupled to said memory cells in a second predetermined order which is different from said first predetermined order, and third means coupled to said memory cells in a third predetermined order which is different from both said first and said second predetermined order for summing the contents of said memory cells in said first memory means in a first, a second and a third predetermined order for generating a plurality of numbers A, B and C corresponding to said summations;
means for generating a P-bit data message including said numbers A, B, C and Q as segments thereof where P is the number of bits in said P-bit data message;
a decoding means;
means for transferring said P-bit data message to said decoding means;
a second memory means in said decoding means having a plurality of memory cells for storing data bits;
means for storing Q logical "one's" in said memory cells in said second memory means;
means for registering said numbers A, B and C from said P-bit data message received in said encoding means;
means for summing the contents of said memory cells in said second memory means in a first, a second and a third predetermined order for generating a plurality of numbers A', B' and C' corresponding to said summations;
means coupled to said registering means and said summing means for comparing said numbers A, B, C, A', B' and C' in pairs A' and A, B' and B and C' and C and generating an output signal if there is an inequality between the members of any one of said pairs; and
means responsive to said output signal for repositioning the contents of the memory cells in said second memory means until A' equals A, B' equals B and C' equals C simultaneously.

11. A data compression apparatus comprising:
a first means having a plurality of memory cells for storing an N-bit data message comprising "one's" and "zeros;"
means for generating a number Q corresponding to the number of "one's" in said data message;
means, including first means coupled to said memory cells in a first predetermined order, second means coupled to said memory cells in a second predetermined order which is different from said first predetermined order, and third means coupled to said memory cells in a third predetermined order which is different from both said first and said second predetermined order for generating a plurality of numbers A, B and C corresponding to a first, a second and a third summation of the contents of said first storing means; and
means for generating and storing a P-bit data message corresponding to said numbers A, B, C and Q.

12. An apparatus according to claim 11 further comprising:
a second means having a plurality of memory cells for storing an N-bit data message;
means for storing Q "one's" in said second storing means;
means, including fourth means coupled to said memory cells in a fourth predetermined order, fifth means coupled to said memory cells in a fifth predetermined order which is different from fourth predetermined order, and sixth means coupled to said memory cells in a sixth predetermined order which is different from both said fourth and said fifth predetermined order for generating a plurality of numbers A', B' and C' corresponding to a first, a second and a third summation of the contents of said second storing means;

means for comparing said numbers A' and A, B' and B and C' and C; and means responsive to said comparing means for reducing the magnitude of any inequality between the numbers A' and A, B' and B and C' and C.

13. An apparatus according to claim 12 wherein said means responsive to said comparing means comprises means for selectively shifting the contents of said second storing means until said numbers A' equals A, B' equals B and C' equals C, simultaneously.

14. An apparatus according to claim 12 wherein said means for generating said numbers A, B and C and said numbers A', B' and C' comprises means for summing columns of the contents of said first and said second storing means.

15. An apparatus according to claim 14 wherein said summing means comprises arithmetic unit means.

16. An apparatus according to claim 15 wherein said first and said second storing means comprise a plurality of memory cells and said arithmetic unit means comprises a plurality of arithmetic units each having a plurality of inputs, and further comprising means for coupling each of said plurality of inputs to predetermined ones of said memory cells for providing said summing of columns of the contents of said first and said second storing means.

17. An apparatus according to claim 13 wherein said shifting means comprises:

means for selectively checking the contents of adjacent ones of said memory cells and means responsive to said checking means for storing a "one" in a cell initially containing a "zero," and a "zero" in a cell initially containing a "one."

18. An apparatus according to claim 17 wherein said checking means further comprises:

a memory for storing addresses of said adjacent ones of said memory cells; and means for selectively addressing first one and then the other of said adjacent ones of said memory cells.

* * * * *